US012039250B2

(12) United States Patent
Zhang

(10) Patent No.: US 12,039,250 B2
(45) Date of Patent: Jul. 16, 2024

(54) INTEGRATED CIRCUIT DEVICE DESIGN METHOD AND SYSTEM

(71) Applicants: TAIWAN SEMICONDUCTOR MANUFACTURING COMPANY, LTD., Hsinchu (TW); TSMC CHINA COMPANY, LIMITED, Songjiang (CN)

(72) Inventor: Ya-Min Zhang, Hsinchu (TW)

(73) Assignees: TAIWAN SEMICONDUCTOR MANUFACTURING COMPANY, LTD., Hsinchu (TW); TSMC CHINA COMPANY, LIMITED, Shanghai (CN)

( * ) Notice: Subject to any disclaimer, the term of this patent is extended or adjusted under 35 U.S.C. 154(b) by 0 days.

(21) Appl. No.: 18/156,671

(22) Filed: Jan. 19, 2023

(65) Prior Publication Data

US 2023/0153514 A1    May 18, 2023

Related U.S. Application Data

(63) Continuation of application No. 17/223,612, filed on Apr. 6, 2021, now Pat. No. 11,568,126, which is a (Continued)

(30) Foreign Application Priority Data

Oct. 15, 2019  (CN) .......................... 201910976697.9

(51) Int. Cl.
*G06F 30/398* (2020.01)
*G06F 30/31* (2020.01)
*G06F 30/392* (2020.01)

(52) U.S. Cl.
CPC ............ *G06F 30/398* (2020.01); *G06F 30/31* (2020.01); *G06F 30/392* (2020.01)

(58) Field of Classification Search
CPC ..................................................... G06F 30/398
(Continued)

(56) References Cited

U.S. PATENT DOCUMENTS 7,260,442 B2   8/2007 Hwang et al.
9,256,709 B2   2/2016 Yu et al.
(Continued)

FOREIGN PATENT DOCUMENTS

CN    100570855 C    12/2009
CN    104809264 B    8/2018
(Continued)

OTHER PUBLICATIONS

Office Action dated Sep. 2, 2021 for corresponding case No. TW 11020859820. (pp. 1-4).

*Primary Examiner* — Eric D Lee
(74) *Attorney, Agent, or Firm* — Hauptman Ham, LLP

(57) ABSTRACT

A method of designing an integrated circuit (IC) device includes generating, using a processor, a design rule instruction macro including one or more of classifying a design rule based on a design rule type, classifying a design rule based on a design rule category, or generating a definition of a derived layer. The method includes using the processor to identify a set of criteria corresponding to an IC manufacturing process, generate a design rule by applying the design rule instruction macro to define relationships within the set of criteria whereby one or more constraints of the design rule are directed to the set of criteria and assigning conditions whereby the one or more constraints of the design rule are selectively directed to the set of criteria, and store the design rule in a storage medium.

20 Claims, 9 Drawing Sheets

Related U.S. Application Data continuation of application No. 16/737,019, filed on Jan. 8, 2020, now Pat. No. 10,990,746.

(58) Field of Classification Search
USPC .......................................................... 716/52
See application file for complete search history.

(56) References Cited

U.S. PATENT DOCUMENTS

| | | | |
|---|---|---|---|
| 9,372,954 B2* | 6/2016 | Zhang | G06F 30/398 |
| 9,785,740 B2 | 10/2017 | Lowe | |
| 10,083,269 B2 | 9/2018 | De Dood et al. | |
| 2003/0237069 A1* | 12/2003 | Mohan | H01L 27/0207 |
| | | | 716/55 |
| 2014/0040838 A1 | 2/2014 | Liu et al. | |
| 2015/0278429 A1 | 10/2015 | Chang | |

FOREIGN PATENT DOCUMENTS

| | | |
|---|---|---|
| JP | 5293521 B2 | 9/2013 |
| TW | I524201 B | 3/2016 |
| TW | I625639 B | 6/2018 |
| TW | I627549 B | 6/2018 |

\* cited by examiner

| MACRO type | Rule No. | Description | Constraint | Rule |
|---|---|---|---|---|
| MACRO_W_1 | $RuleNo | Width of $Layer. | | $Value |
| MACRO_W_2 | $RuleNo | Width of $Layer in channel width direction. | | $Value |
| MACRO_W_3 | $RuleNo | Width of $Layer in channel length direction. | | $Value |
| MACRO_S_1 | $RuleNo | Space of $Layer. | | $Value |
| MACRO_S_2 | $RuleNo | Space of $Layer with different potential. | | $Value |
| MACRO_S_3 | $RuleNo | Space of $LayerA to $LayerB. | a: >= | $Value |
| MACRO_C_1 | $RuleNo | Clearance from $LayerA to $LayerB. | b: = | $Value |
| MACRO_O_1 | $RuleNo | Overlap of $LayerA and $LayerB. | c: <= | $Value |
| MACRO_E_1 | $RuleNo | Extension of $LayerA beyond $LayerB. | | $Value |
| MACRO_E_2 | $RuleNo | Extension of $LayerA beyond $LayerB in channel width direction. | | $Value |
| MACRO_E_3 | $RuleNo | Extension of $LayerA beyond $LayerB in channel length direction. | | $Value |
| MACRO_A_1 | $RuleNo | Area of $Layer. | | $Value |
| MACRO_DN_1 | $RuleNo | Density of $LayerA across $LayerB. | | $Value |
| MACRO_ANT_1 | $RuleNo | Drawn ration of $LayerA perimeter area to $LayerB gate area connected directly to it. | | $Value |
| MACRO_N_1 | $RuleNo | Number of $LayerA. | | $Value |
| MACRO_R_1 | $RuleNo | $LayerA INSIDE $LayerB is not allowed. | | |
| MACRO_R_2 | $RuleNo | $LayerA NOT INSIDE $LayerB is not allowed. | | |
| MACRO_R_3 | $RuleNo | $LayerA CUT $LayerB is not allowed. | | |
| MACRO_R_4 | $RuleNo | $LayerA NOT CUT $LayerB is not allowed. | | |
| MACRO_R_5 | $RuleNo | $LayerA INTERACT $LayerB is not allowed. | | |
| MACRO_R_6 | $RuleNo | $LayerA NOT INTERACT $LayerB is not allowed. | | |
| MACRO_R_7 | $RuleNo | Non-rectangle $Layer is not allowed. | | |
| MACRO_R_8 | $RuleNo | 45-degree ANGLE of $Layer is not allowed. | | |
| MACRO_R_9 | $RuleNo | 90-degree ANGLE of $Layer is not allowed. | | |
| MACRO_R_10 | $RuleNo | $LayerA ENCLOSE $LayerB is not allowed. | | |
| MACRO_R_11 | $RuleNo | $LayerA OUTSIDE $LayerB is not allowed. | | |
| MACRO_R_12 | $RuleNo | An odd finger number of $Layer is not allowed. | | |
| MACRO_R_13 | $RuleNo | An even finger number of $Layer is not allowed. | | |
| MACRO_R_14 | $RuleNo | Non-common drain structure of $Layer is not allowed. | | |
| MACRO_R_15 | $RuleNo | Non-common source structure of $Layer is not allowed. | | |
| MACRO_R_16 | $RuleNo | $LayerA and $LayerB butted is not allowed. | | |
| MACRO_R_17 | $RuleNo | $LayerA and $LayerB non-butted is not allowed. | | |
| MACRO_R_18 | $RuleNo | $LayerA and $LayerB w/o connectivity by metal is not allowed. | | |
| MACRO_R_19 | $RuleNo | $Layer is not allowed. | | |

1.1.2 NLDxyz5 Device

1.1.2.1 NLDxyz5 Device Layout Rule

| HVNB.C.1 | Clearance from HVNB to PO | a | <= | 0.4 |
|---|---|---|---|---|
| HVNB.O.1 | Overlap of HVNB and PO | b | <> | 0.4 |
| HVNB.R.1 | HVNB INSIDE OD NO PO is not allowed | x | - | - |
| HVPO.E.1 | Extension of PO beyond POO (Not HV devices) | c | >= | 0.4 |

⋮

2 Layout Rules And Recommendations

2.1.1 NDD Layout Rule

| NDO.C.1 | Clearance from NDO to PO | NLDxyz5 | d | =+ | 0.3 |
|---|---|---|---|---|---|
| | | NLDxyz6 | e | =+ | 0.3 |
| | | NLDxyz10 | f | =+ | 0.3 |
| | | NLDxyz12 | g | =+ | 0.3 |

INTEGRATED CIRCUIT DEVICE DESIGN METHOD AND SYSTEM

PRIORITY CLAIM

The present application is a continuation of U.S. patent application Ser. No. 17/223,612, filed Apr. 6, 2021, which is a continuation of U.S. patent application Ser. No. 16/737,019, filed Jan. 8, 2020, now U.S. Pat. No. 10,990,746, issued Apr. 27, 2021, which claims priority to China Patent Application No. 201910976697.9, filed Oct. 15, 2019, each of which is incorporated herein by reference in its entirety.

BACKGROUND

The ongoing trend in miniaturizing integrated circuits (ICs) has resulted in progressively smaller and lower power devices that provide increased functionality at high speeds. The miniaturization process has also resulted in increasingly strict design and manufacturing specifications. Various electronic design automation (EDA) tools are developed to generate, optimize, and verify designs for semiconductor devices while ensuring that the design and manufacturing specifications are met.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2 depicts a non-limiting example of a displayed listing of design rule instructions, in accordance with some embodiments.

FIG. 3 depicts a non-limiting example of a displayed table of design rule types, in accordance with some embodiments.

DETAILED DESCRIPTION

Figure 1A:
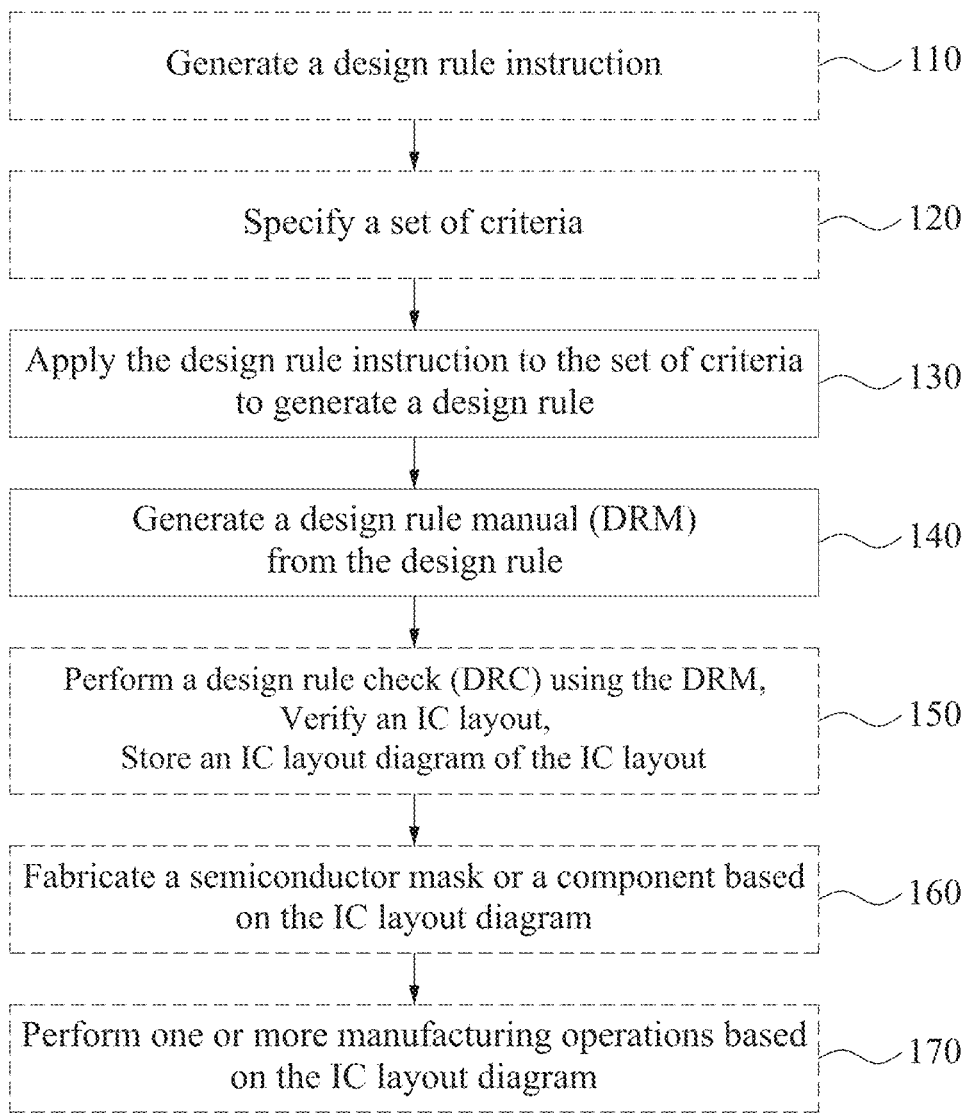
FIG. 1A is a flowchart of a method of designing an IC device, in accordance with some embodiments.

The following disclosure provides many different embodiments, or examples, for implementing different features of the provided subject matter. Specific examples of components, materials, values, steps, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, a method includes specifying a set of criteria corresponding to an IC manufacturing process, applying a design rule instruction to the set of criteria to generate a design rule, and generating a design rule manual (DRM) file that includes the design rule. By applying the instruction to automatically generate the design rule and DRM, an IC device design method and system are more efficient and enable a reduction in error-related activities compared to approaches in which design rules and DRMs are not produced by applying a design rule instruction to automatically generate a design rule.

FIG. 1A is a flowchart of a method 100A of designing an IC device, in accordance with one or more embodiments. Method 100A is usable with an IC device design system, e.g., an IC device design system 700 discussed below with respect to FIG. 7, and/or with an IC manufacturing system, e.g., an IC manufacturing system 800 discussed below with respect to FIG. 8.

The sequence in which the operations of method 100A are depicted in FIG. 1A is for illustration only; the operations of method 100A are capable of being executed in sequences that differ from that depicted in FIG. 1A. In some embodiments, operations in addition to those depicted in FIG. 1A are performed before, between, during, and/or after the operations depicted in FIG. 1A.

In some embodiments, one or more of the operations of method 100A are a subset of operations of a method of designing an IC device. In some embodiments, one or more of the operations of method 100A are a subset of operations of a method of manufacturing an IC device. In various embodiments, one or more of the operations of method 100A are performed by using one or more processors, e.g., a processor 702 discussed below with respect to IC device design system 700 and FIG. 7.

At operation 110, in some embodiments, a design rule instruction is generated. A design rule instruction is one or more computer executable instructions configured to cause a software tool to perform one or more activities on a set of criteria input into the software tool so as to generate a design rule. The design rule is an articulation of one or more constraints followed by an IC designer during the design and manufacture of an IC device. In some embodiments, generating the design rule instruction includes executing some or all of method 100B discussed below with respect to FIGS. 1B-4.

In various embodiments, the design rule includes one or more parameters and contextual information usable by an IC device manufacturer to verify the correctness of a mask set, or to specify geometric and/or connectivity restrictions to ensure sufficient margins to account for variability in one or more IC manufacturing processes. In some embodiments, the design rule is specific to a particular IC manufacturing process, for example, a manufacturing process based on a standard feature size of an IC device fabricated using the particular IC manufacturing process.

In various embodiments, the design rule includes information usable to ensure one or more relationships between or within features and/or layers in a layout of the IC device. In various embodiments, the one or more relationships include a distance along a given direction or along any direction, e.g., a width, space, clearance, overlap, or extension, an area, a density, a ratio, or a prohibition or restriction applicable to one or more features and/or layers. In various embodiments, ensuring the relationships includes ensuring that one or a combination of features or layers is greater than, equal to, or less than a predetermined value or within a predetermined range. In various embodiments, the features and/or layers include one or more layers that define a mask, e.g., a mask 845 discussed below with respect to FIG. 8, or one or more features or layers derived from performing one or more manufacturing operations based on one or more masks.

Using one or more design rules to ensure the feature and/or layer relationships in the layout of the IC device provides assurance that the IC device is formable during the fabrication process based on an IC layout diagram including the layout of the IC device. In some embodiments, the information in the design rule is usable by a software tool, e.g., an EDA tool, to perform a design rule check (DRC) on the layout of the IC device, as discussed below with respect to operation 150.

Generating the design rule instruction includes defining the one or more computer executable instructions so that the software tool generates the design rule including the one or more parameters and contextual information from the set of criteria. In some embodiments, the set of criteria corresponds to a particular IC manufacturing process. In various embodiments, the set of criteria includes one or more of a design rule identifier, definition, and/or description, a feature and/or layer identifier, definition, and/or description, a feature type identifier, definition, and/or description, an association with a device or device type, a label, a unit, a value or range of values, or one or more other parameters corresponding to an aspect of the IC manufacturing process.

Generating the design rule instruction includes assigning conditions to and/or defining relationships within the set of criteria so that the one or more constraints articulated in the design rule are directed to the set of criteria and, in some embodiments, to the corresponding IC manufacturing process.

In embodiments in which the set of criteria corresponds to an IC manufacturing process, the design rule instruction is thereby generated so as to apply conditions and relationships common to multiple IC manufacturing processes to the particular IC manufacturing process corresponding to the set of criteria.

In some embodiments, generating the design rule instruction includes capturing one or more inputs to the software tool as the one or more inputs are being used to generate a design rule from one or more bits of data. In some embodiments, the software tool comprises a spreadsheet application and generating the design rule instruction includes recording a macro using the spreadsheet application. In some embodiments, generating the design rule instruction is performed using a tool such as EXCEL® available from Microsoft Corporation, or another suitable software tool.

In some embodiments, generating the design rule instruction includes copying and/or modifying one or more previously generated design rule instructions. In some embodiments, generating the design rule instruction includes using a software tool, e.g., a software development platform or text editing tool, to generate the one or more computer executable instructions.

In some embodiments, generating the design rule instruction includes storing the design rule instruction on a non-transitory computer-readable storage medium. In various embodiments, storing the design rule instruction includes storing the design rule instruction on a non-transitory computer-readable storage medium on which the software tool is stored or on another non-transitory computer-readable storage medium.

In some embodiments, generating the design rule instruction includes generating a plurality of design rule instructions including the design rule instruction. In some embodiments, storing the design rule instruction includes storing a plurality of design rule instructions including the design rule instruction.

Figure 1B:
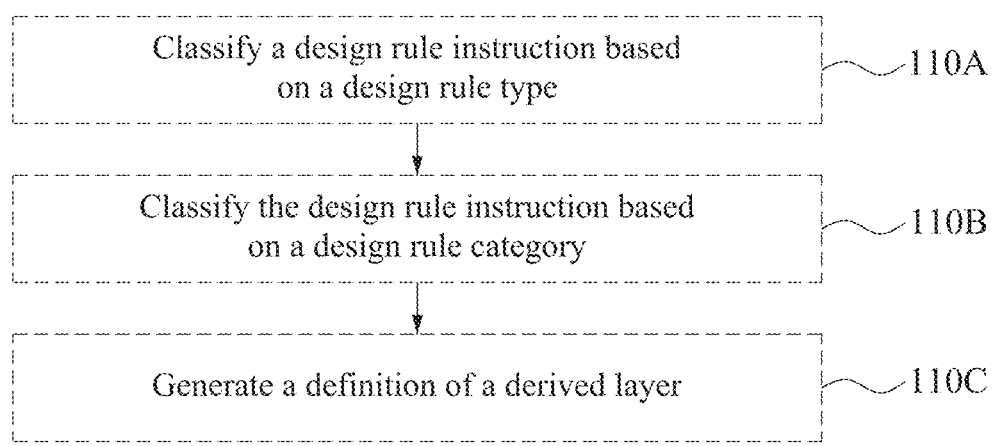
FIG. 1B is a flowchart of a method of generating a design rule instruction, in accordance with some embodiments.

FIG. 1B is a flowchart of method 100B of generating a design rule instruction, in accordance with some embodiments. One or more of the operations of method 100B are usable as some or all of operation 110 and are illustrated by the non-limiting examples of FIGS. 2-4.

The sequence in which the operations of method 100B are depicted in FIG. 1B is for illustration only; the operations of method 100B are capable of being executed in sequences that differ from that depicted in FIG. 1B. In some embodiments, operations in addition to those depicted in FIG. 1B are performed before, between, during, and/or after the operations depicted in FIG. 1B.

At operation 110A, in some embodiments, a design rule instruction is classified based on a design rule type. Classifying the design rule instruction based on the design rule type includes identifying a design rule type corresponding to one of the relationships between or within the features and/or layers in the layout of the IC device.

Classifying the design rule instruction based on the design rule type facilitates generating multiple design rules corresponding to a particular feature and/or layer relationship such that the multiple design rules are capable of being generated for a variety of features and/or layers while having consistent formats, identifiers, definitions, and descriptions.

FIG. 2 depicts a non-limiting example of a displayed listing 200 of design rule instructions, in accordance with some embodiments. In displayed listing 200, design rule instructions are classified as MACRO types including, e.g., those corresponding to particular widths, spaces, extensions, and restrictions.

Each MACRO type is associated with a design rule number and a design rule description. A first subset of the MACRO types is further associated with a constraint choice and a value, the constraint choice including "a:>=" corresponding to a relationship of greater than or equal to, "b:=" corresponding to a relationship of equality, and "c:<=" corresponding to a relationship of less than or equal to. The second subset of the MACRO types corresponds to restrictions, each restriction being articulated entirely within the description associated with the corresponding MACRO type.

At operation 110B, in some embodiments, a design rule instruction is classified based on a design rule category. Classifying the design rule instruction based on the design rule category includes categorizing the design rule instruction according to a feature or feature type, layer or layer type, derived layer or derived layer type, device or device type, device or isolation region, or other structurally oriented basis associated with the layout of the IC device.

Classifying the design rule instruction based on the design rule category facilitates grouping multiple design rules corresponding to a particular feature, layer, device, region, or other criterion such that the multiple design rules are capable of being selected, displayed, and/or generated based on the category associated with the multiple design rules.

Figure 3:
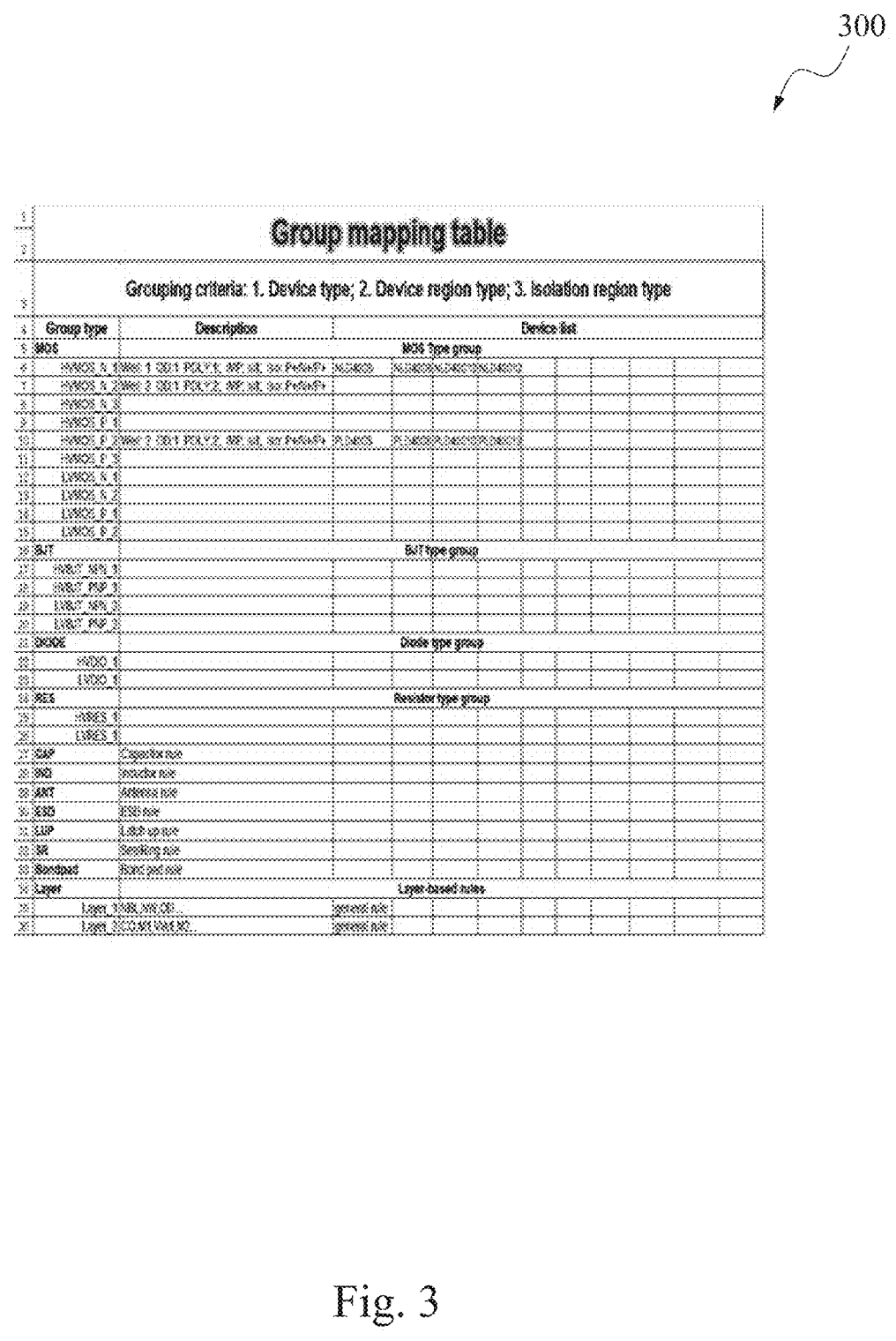

FIG. 3 depicts a non-limiting example of a displayed table 300 of a plurality of design rule types, in accordance with some embodiments. In displayed table 300, design rule instructions are arranged in groups based on design rule instruction classifications including, e.g., device and layer types.

At operation 110C, in some embodiments, a definition of a derived layer is generated. Generating a definition of a derived layer includes assigning a derived layer number, a term, and a definition to the derived layer in the layout of the IC device. In various embodiments, generating the definition includes associating one or more remarks with the derived layer and/or linking one or more rule links to the derived layer.

Generating a definition of a derived layer facilitates generating design rules corresponding to derived layers having consistent formats, identifiers, definitions, and descriptions, thereby acting to minimizing a risk of mistakes related to layers derived from performing one or more manufacturing operations based on one or more masks.

Figure 4:
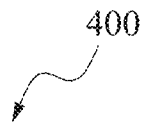
FIG. 4 depicts a non-limiting example of a displayed listing of design rule layer definitions, in accordance with some embodiments.

FIG. 4 depicts a non-limiting example of a displayed listing 400 of design rule layer definitions, in accordance with some embodiments. In displayed listing 400, each derived layer includes a derived layer number associated with a term, a definition, a remark, and, in some cases, rule link information.

At operation 120, in some embodiments, the set of criteria is specified. Specifying the set of criteria includes identifying one or more bits of data usable by the design rule instruction to generate the design rule. In some embodiments, the one or more bits of data correspond to a particular IC manufacturing process. In some embodiments, specifying the set of criteria includes specifying at least one of a value, e.g., a feature dimension, a feature geometry, a spacing between features, or a feature overlap dimension, a unit, or a layer, device, or device type identifier of the IC manufacturing process.

In some embodiments, specifying the set of criteria includes receiving the set of criteria with the software tool discussed above with respect to operation 110. In some embodiments, specifying the set of criteria includes receiving the set of criteria through a template. In some embodiments, specifying the set of criteria includes receiving the set of criteria through a user interface, e.g., an I/O interface 710 discussed below with respect to IC device design system 700 and FIG. 7.

In some embodiments, specifying the set of criteria includes a user manually entering the set of criteria into the user interface. In various embodiments, specifying the set of criteria includes a system automatically importing the set of criteria into the software tool from one or more electronic files, initiated either automatically or through one or more user inputs. In some embodiments, specifying the set of criteria includes specifying a plurality of sets of criteria including the set of criteria.

Figure 5:
FIG. 5 depicts a non-limiting example of a displayed design rule template, in accordance with some embodiments.

FIG. 5 depicts a non-limiting example of a displayed template 500 usable to specify a set of criteria, in accordance with some embodiments. Template 500 includes sections for each of design rule instruction types MACRO_W corresponding to a width relationship, MACRO_S corresponding to a space relationship, MACRO_E corresponding to an extension relationship, and MACRO_O corresponding to an overlap relationship.

Within each section, the design rule instruction type is further designated, e.g., by "1" or "1b," to select one of multiple constraints, e.g., the constraints depicted in FIG. 2, to be applied to the design rule. For each instance of the designated design rule instruction type and constraint, additional criteria include a design rule identifier "RuleNo.," layer identifiers "Layer1" and Layer2," descriptions "Condition" and "label," and a value "Value."

At operation 130, the design rule instruction is applied to the set of criteria to generate the design rule discussed above with respect to operation 110. Generating the design rule includes executing the design rule instruction on the software tool. In various embodiments, the design rule instruction is executed in response to one or more user inputs to the software tool or to one or more computer executable instructions, e.g., a batch file or another design rule instruction configured to initiate application of the design rule instruction.

As a non-limiting example, generating a design rule based on the second instance of design rule instruction MACRO_E_1 depicted in FIG. 5 includes generating the design rule formatted according to design rule instruction MACRO_E_1c and including design rule identifier "HVPO.E.1," layers "PO" and "POO," description "Not HV devices," constraint ">=," and value "0.4."

In some embodiments, generating the design rule includes retrieving the design rule instruction from a non-transitory computer-readable storage medium. In various embodiments, retrieving the design rule instruction includes retrieving the design rule instruction from a non-transitory computer-readable storage medium on which the software tool is stored or from another non-transitory computer-readable storage medium.

In some embodiments, generating the design rule includes displaying the design rule on the user interface. In some embodiments, displaying the design rule includes displaying a plurality of design rules including the design rule. In some embodiments, generating the design rule includes verifying compatibility between the set of criteria and the design rule instruction, and displaying a result of the verification on the user interface.

In some embodiments, generating the design rule includes storing the design rule on a non-transitory computer-readable storage medium. In various embodiments, storing the design rule includes storing the design rule on a non-transitory computer-readable storage medium on which the software tool is stored or on another non-transitory computer-readable storage medium.

In some embodiments, generating the design rule includes generating a plurality of design rules including the design rule. In various embodiments, generating the plurality of design rules includes applying a single design rule instruction to a plurality of sets of criteria, applying a plurality of design rule instructions to a single set of criteria, applying each design rule instruction of a plurality of design rule instructions to a corresponding set of criteria of a plurality of sets of criteria, or a combination thereof.

At operation 140, a DRM is generated from the design rule. The DRM is an electronic file that includes the design rule, and generating the DRM includes generating the electronic file using the software tool. In various embodiments, the electronic file is an ASCII text file or another suitable file type, e.g., a WORD® compatible file or a portable document format (PDF) file.

Figure 6:
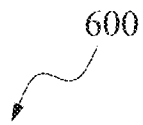
FIG. 6 depicts a non-limiting example of a design rule manual (DRM), in accordance with some embodiments.

FIG. 6 depicts a non-limiting example of a portion of a DRM 600, in accordance with some embodiments. DRM 600 is generated according to operation 140 and includes a first table including a set of design rules in which each rule corresponds to a single design constraint and a second table including a set of design rules in which each design rule corresponds to multiple design constraints.

In the first table, the fourth design rule corresponds to the non-limiting example discussed above with respect to operation 130, in which design rule "HVPO.E.1" includes layers "PO" and "POO," description "Not HV devices," constraint ">=," and value "0.4," each formatted according to design rule instruction MACRO_E_1c.

In some embodiments, generating the DRM includes storing the DRM on a non-transitory computer-readable storage medium. In various embodiments, storing the DRM includes storing the DRM on a non-transitory computer-readable storage medium on which the software tool is stored or on another non-transitory computer-readable storage medium. In some embodiments, storing the DRM includes exporting the DRM from an IC device design system, e.g., IC device design system 700 discussed below with respect to FIG. 7.

In some embodiments, generating the DRM includes importing the DRM using a software tool different from the software tool used to generate the DRM. In various embodiments, the different software tools are executed on a same processor, or on separate processors. In some embodiments, separate processors are connected by a network, e.g., network 714 discussed below with respect to IC device design system 700 and FIG. 7. In some embodiments, importing the DRM is performed by an EDA tool.

Generating the DRM is performed by the software tool. In various embodiments, the DRM is generated in response to one or more user inputs to the software tool or to one or more computer executable instructions, e.g., a batch file configured to initiate generation of the DRM. In some embodiments, the DRM is generated using a DRM generation instruction created in the manner described above with respect to a design rule instruction, e.g., by capturing one or more inputs to the software tool as a DRM is generated from a design rule.

In some embodiments, generating the DRM includes generating the DRM including a group of design rules, also referred to as a set of design rules, that includes the design rule. In some embodiments, the group of design rules is one group of a plurality of groups of design rules, and generating the DRM includes selecting the group from the plurality of groups.

In some embodiments, the group of design rules is selected in response to one or more user inputs to the software tool. In some embodiments, selecting the group of design rules is performed by the DRM generation instruction in response to one or more user inputs to the software tool. In some embodiments, the group of design rules is selected in response to one or more user inputs received through a user interface, e.g., I/O interface 710 discussed below with respect to IC device design system 700 and FIG. 7.

In some embodiments, selecting the group from the plurality of groups includes sorting the plurality of design rules into the groups. In some embodiments, the plurality of design rules is sorted in response to one or more user inputs to the software tool. In some embodiments, the group of design rules is sorted in response to one or more user inputs received through a user interface, e.g., I/O interface 710 discussed below with respect to IC device design system 700 and FIG. 7. In some embodiments, sorting the plurality of design rules into the groups includes displaying the sorted groups on the user interface. In some embodiments, displaying the sorted groups on the user interface includes displaying the groups as a table segmented by group.

In various embodiments, sorting the plurality of design rules into the plurality of groups is based on one or more of a device type, a device region type, a device feature type, or a design rule instruction type.

At operation 150, in some embodiments, a DRC is performed on the layout of at least a portion of the IC device using the design rule from the DRM, the IC layout is either verified or modified based on the result of the DRC, and a layout diagram of the IC layout is stored on a non-transitory computer-readable medium. In some embodiments, performing the DRC includes performing a DRC using a plurality of design rules including the design rule.

Performing the DRC includes using a software tool to apply the one or more design rules in the DRM to one or more features of the at least a portion of the IC device in the IC layout and verify that the layout of the one or more features complies with the one or more design rules. In some embodiments, the design rule check is performed by an EDA tool. In various embodiments, the EDA tool and the software tool used to generate the DRM are executed on a same processor, or on separate processors. In some embodiments, separate processors are connected by a network, e.g., network 714 discussed below with respect to IC device design system 700 and FIG. 7.

In some embodiments, the DRC is performed during generation of the IC layout. In some embodiments, the tool used to generate the IC layout is also used to perform the DRC. In some embodiments, a layout editor includes one or more files used by the EDA tool to edit the IC layout of the IC device. In various embodiments, the layout editor is either generated by the EDA tool or by a software tool other than the EDA and used by the EDA tool. In some embodiments, the DRC is performed by a separate tool following generation of the layout diagram of the IC layout.

If the IC layout is not verified by a first DRC using the DRM, the IC layout is modified, an additional DRC is performed, and this sequence is repeated if needed until the IC layout is verified by a subsequent DRC using the DRM. In these cases, verifying the IC layout includes modifying the IC layout.

Based on verifying the IC layout by performing the DRC, the IC layout diagram comprising the IC layout is stored on a non-transitory computer-readable medium. In various embodiments, storing the IC layout diagram is performed before, during, or after verifying the IC layout by performing the DRC. In various embodiments, storing the IC layout diagram includes storing the IC layout diagram on a non-transitory computer-readable storage medium on which the tool used to generate the IC layout, e.g., the EDA tool, is stored or on another non-transitory computer-readable storage medium.

At operation 160, in some embodiments, at least one of one or more semiconductor masks, or at least one component in a layer of a semiconductor IC is fabricated based on the IC layout diagram. Fabricating one or more semiconductor masks or at least one component in a layer of a semiconductor IC is discussed below with respect to FIG. 8.

At operation 170, in some embodiments, one or more manufacturing operations are performed based on the IC layout diagram. In some embodiments, performing one or more manufacturing operations includes performing one or more lithographic exposures based on the IC layout diagram. Performing one or more manufacturing operations, e.g., one or more lithographic exposures, based on the IC layout diagram is discussed below with respect to FIG. 8.

By performing some or all of the operations of method 100A, a design rule instruction is used to generate a design rule included in a DRM, and an IC device is thereby designed and manufactured more efficiently and potentially with fewer errors compared to approaches in which design rules and DRMs are not produced by applying a design rule instruction to automatically generate a design rule.

Further, automated generation and management of design rules using design rule instructions in accordance with method 100A enables quality control and source data tracing of design rules included in DRMs to be performed more efficiently than in approaches in which design rules and DRMs are not produced by applying a design rule instruction to automatically generate a design rule.

Additional details regarding an IC device design system and method are found, e.g., in U.S. Pat. No. 9,372,954, granted Jun. 21, 2016, the entirety of which is hereby incorporated by reference.

Figure 7:
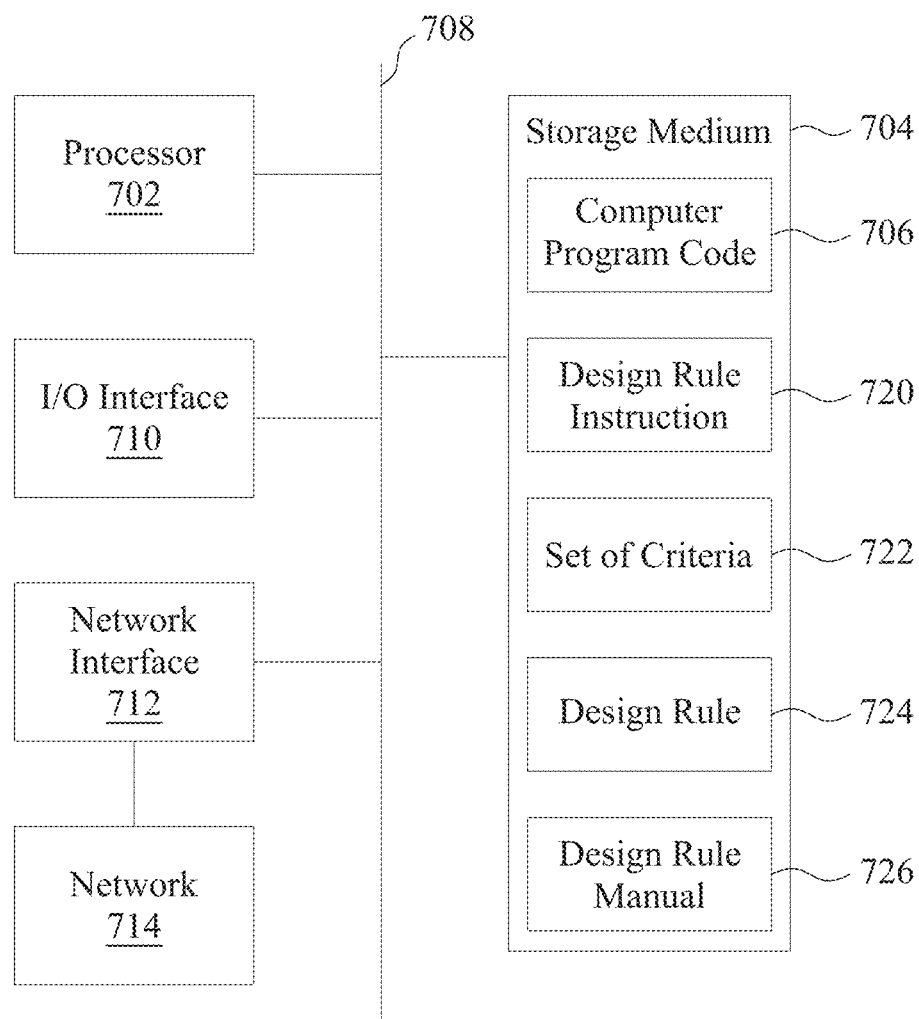
FIG. 7 is a block diagram of an IC device design system, in accordance with some embodiments.

FIG. 7 is a block diagram of IC device design system 700, in accordance with some embodiments. One or more operations of methods 100A and 100B, discussed above with respect to FIGS. 1A-6, are implementable using IC device design system 700, in accordance with some embodiments.

In some embodiments, IC device design system 700 is a computing device including a hardware processor 702 and a non-transitory computer-readable storage medium 704. Non-transitory computer-readable storage medium 704, amongst other things, is encoded with, i.e., stores, computer program code 706, i.e., a set of executable instructions. Execution of instructions 706 by hardware processor 702 represents (at least in part) an IC device design system which implements a portion or all of, e.g., a method 100A discussed above with respect to FIG. 1A and/or a method 100B discussed above with respect to FIG. 1B (hereinafter, the noted processes and/or methods).

Processor 702 is electrically coupled to non-transitory computer-readable storage medium 704 via a bus 708. Processor 702 is also electrically coupled to an I/O interface 710 by bus 708. A network interface 712 is also electrically connected to processor 702 via bus 708. Network interface 712 is connected to a network 714, so that processor 702 and non-transitory, computer-readable storage medium 704 are capable of connecting to external elements via network 714. Processor 702 is configured to execute computer program code 706 encoded in non-transitory computer-readable storage medium 704 in order to cause IC device design system 700 to be usable for performing a portion or all of the noted processes and/or methods. In one or more embodiments, processor 702 is a central processing unit (CPU), a multi-processor, a distributed processing system, an application specific integrated circuit (ASIC), and/or a suitable processing unit.

In one or more embodiments, non-transitory computer-readable storage medium 704 is an electronic, magnetic, optical, electromagnetic, infrared, and/or a semiconductor system (or apparatus or device). For example, non-transitory computer-readable storage medium 704 includes a semiconductor or solid-state memory, a magnetic tape, a removable computer diskette, a random access memory (RAM), a read-only memory (ROM), a rigid magnetic disk, and/or an optical disk. In one or more embodiments using optical disks, non-transitory computer-readable storage medium 704 includes a compact disk-read only memory (CD-ROM), a compact disk-read/write (CD-R/W), and/or a digital video disc (DVD).

In one or more embodiments, non-transitory computer-readable storage medium 704 stores computer program code 706 configured to cause IC device design system 700 to be usable for performing a portion or all of the noted processes and/or methods. In one or more embodiments, non-transitory computer-readable storage medium 704 also stores information which facilitates performing a portion or all of the noted processes and/or methods. In various embodiments, non-transitory computer-readable storage medium 704 stores one or a combination of at least one design rule instruction 720, at least one set of criteria 722, at least one design rule 724, and/or at least one DRM 726, each discussed above with respect to methods 100A and 100B and FIGS. 1A-6.

IC device design system 700 includes I/O interface 710. I/O interface 710 is coupled to external circuitry. In various embodiments, I/O interface 710 includes one or a combination of a keyboard, keypad, mouse, trackball, trackpad, display, touchscreen, and/or cursor direction keys for communicating information and commands to and/or from processor 702.

IC device design system 700 also includes network interface 712 coupled to processor 702. Network interface 712 allows system 700 to communicate with network 714, to which one or more other computer systems are connected. Network interface 712 includes wireless network interfaces such as BLUETOOTH, WIFI, WIMAX, GPRS, or WCDMA; or wired network interfaces such as ETHERNET, USB, or IEEE-1364. In one or more embodiments, a portion or all of the noted processes and/or methods, is implemented in two or more systems 700.

IC device design system 700 is configured to receive information through I/O interface 710. The information received through I/O interface 710 includes one or a combination of at least one design rule instructions, at least one set of criteria, at least one design rule, at least one DRM, and/or other parameters for processing by processor 702. The information is transferred to processor 702 via bus 708. IC device design system 700 is configured to transmit and/or receive information related to a user interface through I/O interface 710.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, an IC layout diagram is generated using a tool such as VIR- TUOSO® available from CADENCE DESIGN SYSTEMS, Inc., or another suitable layout generating tool.

In some embodiments, the processes are realized as functions of a program stored in a non-transitory computer-readable recording medium. Examples of a non-transitory computer-readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

By being usable to implement one or more operations of method 100A, as discussed above with respect to FIGS. 1A-6, IC device design system 700 and a non-transitory computer-readable recording medium, e.g., non-transitory computer-readable recording medium 704, enable the benefits discussed above with respect to method 100A.

Figure 8:
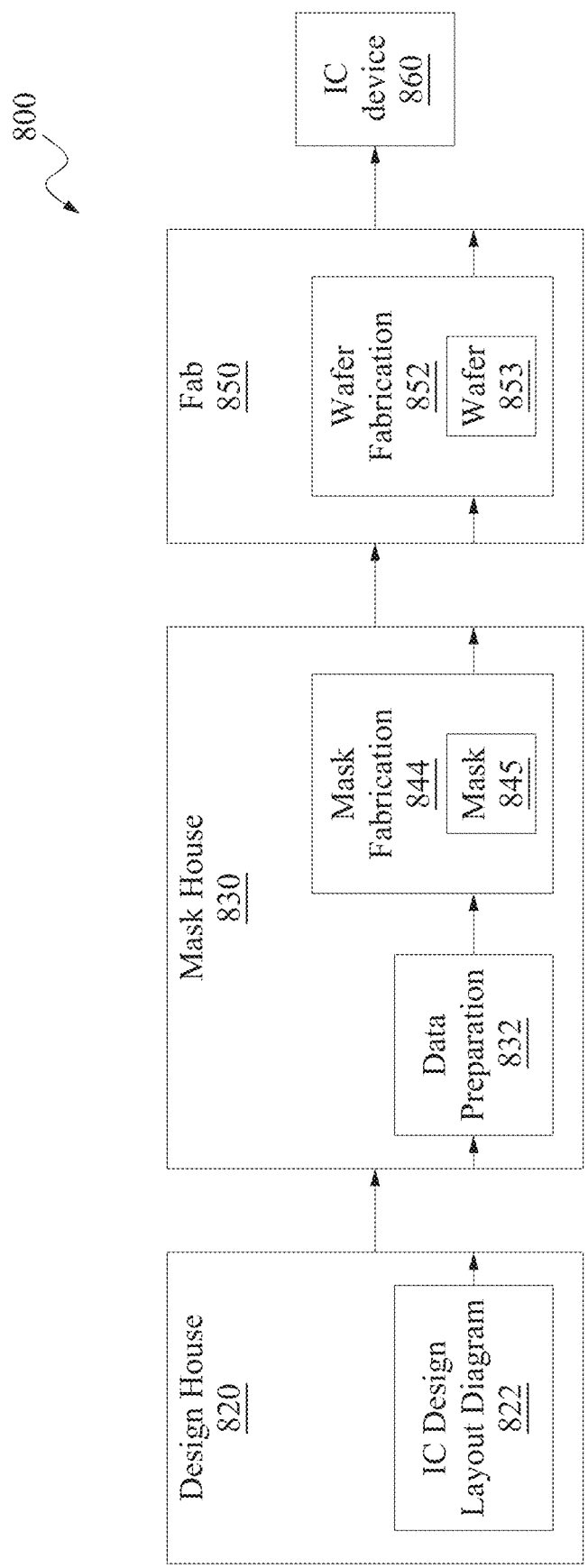
FIG. 8 is a block diagram of an integrated circuit (IC) manufacturing system, and an IC manufacturing flow associated therewith, in accordance with some embodiments.

FIG. 8 is a block diagram of IC manufacturing system 800, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 800.

In FIG. 8, IC manufacturing system 800 includes entities, such as a design house 820, a mask house 830, and an IC manufacturer/fabricator ("fab") 850, that interact with one another in the design, development, and manufacturing cycles and/or services related to manufacturing an IC device 860. The entities in system 800 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 820, mask house 830, and IC fab 850 is owned by a single larger company. In some embodiments, two or more of design house 820, mask house 830, and IC fab 850 coexist in a common facility and use common resources.

Design house (or design team) 820 generates an IC design layout diagram 822 based on method 100A, discussed above with respect to FIGS. 1A-6. IC design layout diagram 822 includes various geometrical patterns that correspond to patterns of metal, oxide, or semiconductor layers that make up the various components of IC device 860 to be fabricated. The various layers combine to form various IC features. For example, a portion of IC design layout diagram 822 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 820 implements a proper design procedure including method 100A, discussed above with respect to FIGS. 1A-6, to form IC design layout diagram 822. The design procedure includes one or more of logic design, physical design or place and route. IC design layout diagram 822 is presented in one or more data files having information of the geometrical patterns. For example, IC design layout diagram 822 can be expressed in a GDSII file format or DFII file format.

Mask house 830 includes data preparation 832 and mask fabrication 844. Mask house 830 uses IC design layout diagram 822 to manufacture one or more masks 845 to be used for fabricating the various layers of IC device 860 according to IC design layout diagram 822. Mask house 830 performs mask data preparation 832, where IC design layout diagram 822 is translated into a representative data file ("RDF"). Mask data preparation 832 provides the RDF to mask fabrication 844. Mask fabrication 844 includes a mask writer. A mask writer converts the RDF to an image on a substrate, such as a mask (reticle) 845 or a semiconductor wafer 853. The design layout diagram 822 is manipulated by mask data preparation 832 to comply with particular characteristics of the mask writer and/or requirements of IC fab 850. In FIG. 8, mask data preparation 832 and mask fabrication 844 are illustrated as separate elements. In some embodiments, mask data preparation 832 and mask fabrication 844 can be collectively referred to as mask data preparation.

In some embodiments, mask data preparation 832 includes optical proximity correction (OPC) which uses lithography enhancement techniques to compensate for image errors, such as those that can arise from diffraction, interference, other process effects and the like. OPC adjusts IC design layout diagram 822. In some embodiments, mask data preparation 832 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 832 includes a mask rule checker (MRC) that checks the IC design layout diagram 822 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 822 to compensate for limitations during mask fabrication 844, which may undo part of the modifications performed by OPC in order to meet mask creation rules.

In some embodiments, mask data preparation 832 includes lithography process checking (LPC) that simulates processing that will be implemented by IC fab 850 to fabricate IC device 860. LPC simulates this processing based on IC design layout diagram 822 to create a simulated manufactured device, such as IC device 860. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 822.

It should be understood that the above description of mask data preparation 832 has been simplified for the purposes of clarity. In some embodiments, data preparation 832 includes additional features such as a logic operation (LOP) to modify the IC design layout diagram 822 according to manufacturing rules. Additionally, the processes applied to IC design layout diagram 822 during data preparation 832 may be executed in a variety of different orders.

After mask data preparation 832 and during mask fabrication 844, a mask 845 or a group of masks 845 are fabricated based on the modified IC design layout diagram 822. In some embodiments, mask fabrication 844 includes performing one or more lithographic exposures based on IC design layout diagram 822. In some embodiments, an electron-beam (e-beam) or a mechanism of multiple e-beams is used to form a pattern on a mask (photomask or reticle) 845 based on the modified IC design layout diagram 822. Mask 845 can be formed in various technologies. In some embodiments, mask 845 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 845 includes a transparent substrate (e.g., fused quartz) and an opaque material (e.g., chromium) coated in the opaque regions of the binary mask. In another example, mask 845 is formed using a phase shift technology. In a phase shift mask (PSM) version of mask 845, various features in the pattern formed on the phase shift mask are configured to have proper phase difference to enhance the resolution and imaging quality. In various examples, the phase shift mask can be attenuated PSM or alternating PSM. The mask(s) generated by mask fabrication 844 is used in a variety of processes. For example, such a mask(s) is used in an ion implantation process to form various doped regions in semiconductor wafer 853, in an etching process to form various etching regions in semiconductor wafer 853, and/or in other suitable processes.

IC fab 850 includes wafer fabrication 852. IC fab 850 is an IC fabrication business that includes one or more manufacturing facilities for the fabrication of a variety of different IC products. In some embodiments, IC Fab 850 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 850 uses mask(s) 845 fabricated by mask house 830 to fabricate IC device 860. Thus, IC fab 850 at least indirectly uses IC design layout diagram 822 to fabricate IC device 860. In some embodiments, semiconductor wafer 853 is fabricated by IC fab 850 using mask(s) 845 to form IC device 860. In some embodiments, the IC fabrication includes performing one or more lithographic exposures based at least indirectly on IC design layout diagram 822. Semiconductor wafer 853 includes a silicon substrate or other proper substrate having material layers formed thereon. Semiconductor wafer 853 further includes one or more of various doped regions, dielectric features, multi-level interconnects, and the like (formed at subsequent manufacturing steps).

Details regarding an IC manufacturing system (e.g., system 800 of FIG. 8), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

A system of one or more computers are configured to perform particular operations or actions by virtue of having software, firmware, hardware, or a combination of them installed on the system that in operation causes or cause the system to perform the actions. One or more computer programs are configured to perform particular operations or actions by virtue of including instructions that, when executed by data processing apparatus, cause the apparatus to perform the actions. In some embodiments, a method of designing an IC device includes generating, using a processor, a design rule instruction macro, generating the design rule instruction macro including one or more of classifying a design rule based on a design rule type, classifying a design rule based on a design rule category, or generating a definition of a derived layer, identifying, using the processor, a set of criteria corresponding to an IC manufacturing process, generating, by the processor, a design rule by applying the design rule instruction macro to define relationships within the set of criteria whereby one or more constraints of the design rule are directed to the set of criteria and assigning conditions whereby the one or more constraints of the design rule are selectively directed to the set of criteria, and storing the design rule in a storage medium.

In some embodiments, non-transitory computer-readable medium includes computer executable instructions configured to carry out a method of designing an IC device including generating a design rule instruction macro including one or more of classifying a design rule based on a design rule type, classifying a design rule based on a design rule category, or generating a definition of a derived layer, identifying a set of criteria corresponding to an IC manufacturing process, generating a design rule by applying the design rule instruction macro to define relationships within the set of criteria whereby one or more constraints of the design rule are directed to the set of criteria and assigning conditions whereby the one or more constraints of the design rule are selectively directed to the set of criteria, and storing the design rule in a storage medium.

In some embodiments, an IC device design system includes at least one processor and at least one memory including computer program code for one or more programs, the at least one memory and the computer program code being configured to, with the at least one processor, cause the system to generate a design rule instruction macro by classifying a design rule based on a design rule type, classifying a design rule based on a design rule category, and/or generating a definition of a derived layer, identify a set of criteria corresponding to an IC manufacturing process, generate a design rule by applying the design rule instruction macro to define relationships within the set of criteria whereby one or more constraints of the design rule are directed to the set of criteria and assigning conditions whereby the one or more constraints of the design rule are selectively directed to the set of criteria, and store the design rule in a storage medium.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A method of designing an integrated circuit (IC) device, the method comprising:

generating, using a processor, a design rule instruction macro, the generating the design rule instruction macro comprising one or more of classifying a design rule based on a design rule type, classifying a design rule based on a design rule category, or generating a definition of a derived layer;

identifying, using the processor, a set of criteria corresponding to an IC manufacturing process;

generating, by the processor, a new design rule by:
    executing the design rule instruction macro to define relationships within the set of criteria whereby one or more newly articulated constraints of the design rule are generated by being directed to the set of criteria; and
    assigning conditions whereby the one or more constraints of the design rule are selectively directed to the set of criteria; and
storing the design rule in a storage medium.

2. The method of claim 1, wherein the generating the design rule instruction macro comprises capturing one or more inputs to a software tool as the one or more inputs are being used to generate a design rule from one or more bits of data.

3. The method of claim 1, wherein the generating the design rule instruction macro comprises classifying the design rule based on the design rule type comprising one or more of a width, space, extension, or restriction.

4. The method of claim 1, wherein the generating the design rule instruction macro comprises classifying the design rule based on the design category based on one or more of a feature or feature type, layer or layer type, derived layer or derived layer type, device or device type, or device or isolation region.

5. The method of claim 1, wherein the generating the design rule instruction macro comprises generating the definition of the derived layer comprising one or more of assigning a derived layer number, a term, and a definition to the derived layer, associating one or more remarks with the derived layer, or linking one or more rule links to the derived layer.

6. The method of claim 1, wherein the generating the design rule comprises:
    verifying compatibility between the set of criteria and the design rule instruction macro; and
    displaying a result of the verification on a user interface.

7. The method of claim 1, wherein the executing the design rule instruction macro comprises applying conditions and relationships common to multiple IC manufacturing processes to the IC manufacturing process corresponding to the set of criteria.

8. The method of claim 1, further comprising:
    generating a design rule manual using the design rule, wherein the storing the design rule in the storage medium comprises storing the design rule manual in the storage medium.

9. The method of claim 8, further comprising performing a design rule check using the design rule manual.

10. A non-transitory computer-readable medium comprising computer executable instructions configured to carry out a method of designing an integrated circuit (IC) device, wherein the method comprises:
    generating a design rule instruction macro, the generating the design rule instruction macro comprising one or more of classifying a design rule based on a design rule type, classifying a design rule based on a design rule category, or generating a definition of a derived layer;
    identifying a set of criteria corresponding to an IC manufacturing process;
    generating a new design rule by:
        executing the design rule instruction macro to define relationships within the set of criteria whereby one or more newly articulated constraints of the design rule are generated by being directed to the set of criteria; and
        assigning conditions whereby the one or more constraints of the design rule are selectively directed to the set of criteria; and
    storing the design rule in a storage medium.

11. The non-transitory computer-readable medium of claim 10, wherein the generating the design rule instruction macro comprises classifying the design rule based on the design rule type comprising one or more of a width, space, extension, or restriction.

12. The non-transitory computer-readable medium of claim 10, wherein the generating the design rule instruction macro comprises classifying the design rule based on the design category based on one or more of a feature or feature type, layer or layer type, derived layer or derived layer type, device or device type, or device or isolation region.

13. The non-transitory computer-readable medium of claim 10, wherein the generating the design rule instruction macro comprises generating the definition of the derived layer comprising one or more of assigning a derived layer number, a term, and a definition to the derived layer, associating one or more remarks with the derived layer, or linking one or more rule links to the derived layer.

14. The non-transitory computer-readable medium of claim 10, wherein the executing the design rule instruction macro comprises applying conditions and relationships common to multiple IC manufacturing processes to the IC manufacturing process corresponding to the set of criteria.

15. An integrated circuit (IC) device design system comprising:
    at least one processor; and
    at least one memory including computer program code for one or more programs, the at least one memory and the computer program code being configured to, with the at least one processor, cause the system to:
        generate a design rule instruction macro by classifying a design rule based on a design rule type, classifying a design rule based on a design rule category, and/or generating a definition of a derived layer;
        identify a set of criteria corresponding to an IC manufacturing process;
        generate a new design rule by:
            executing the design rule instruction macro to define relationships within the set of criteria whereby one or more newly articulated constraints of the design rule are generated by being directed to the set of criteria; and
            assigning conditions whereby the one or more constraints of the design rule are selectively directed to the set of criteria; and
        store the design rule in a storage medium.

16. The system of claim 15, wherein the at least one memory and the computer program code are configured to, with the at least one processor, cause the IC device design system to:
    generate the design rule instruction macro by classifying the design rule based on the design rule type comprising one or more of a width, space, extension, or restriction.

17. The system of claim 15, wherein the at least one memory and the computer program code are configured to, with the at least one processor, cause the IC device design system to:
classify the design rule based on the design category based on one or more of a feature or feature type, layer or layer type, derived layer or derived layer type, device or device type, or device or isolation region.

18. The system of claim 15, wherein the at least one memory and the computer program code are configured to, with the at least one processor, cause the IC device design system to:
generate the definition of the derived layer by assigning a derived layer number, a term, and a definition to the derived layer, associating one or more remarks with the derived layer, and/or linking one or more rule links to the derived layer.

19. The system of claim 15, wherein the at least one memory and the computer program code are configured to, with the at least one processor, cause the IC device design system to generate the design rule by:
verifying compatibility between the set of criteria and the design rule instruction macro; and
displaying a result of the verification on a user interface of the system.

20. The system of claim 15, wherein the at least one memory and the computer program code are configured to, with the at least one processor, cause the IC device design system to:
generate a design rule manual using the design rule, and store the design rule in the storage medium by storing the design rule manual in the storage medium.

\* \* \* \* \*